(12) United States Patent
Liang et al.

(10) Patent No.: US 11,387,071 B2
(45) Date of Patent: Jul. 12, 2022

(54) MULTI-SOURCE ION BEAM ETCH SYSTEM

(71) Applicant: APPLIED MATERIALS, INC., Santa Clara, CA (US)

(72) Inventors: Qiwei Liang, Fremont, CA (US); Srinivas D Nemani, Sunnyvale, CA (US); Ellie Yieh, San Jose, CA (US); Douglas Buchberger, Livermore, CA (US); Chentsau Chris Ying, Cupertino, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 394 days.

(21) Appl. No.: 16/733,299

(22) Filed: Jan. 3, 2020

(65) Prior Publication Data

US 2021/0104374 A1 Apr. 8, 2021

Related U.S. Application Data

(60) Provisional application No. 62/911,326, filed on Oct. 6, 2019.

(51) Int. Cl.
*H01J 37/09* (2006.01)
*H01J 37/305* (2006.01)
(Continued)

(52) U.S. Cl.
CPC .............. *H01J 37/09* (2013.01); *H01J 37/20* (2013.01); *H01J 37/30* (2013.01);
(Continued)

(58) Field of Classification Search
CPC .. H01J 37/09; H01J 37/20; H01J 37/30; H01J 37/3053; H01J 2237/2027;
(Continued)

(56) References Cited

U.S. PATENT DOCUMENTS 8,076,650 B2   12/2011   Smith et al.
8,405,054 B2   3/2013    Smith et al.
(Continued)

FOREIGN PATENT DOCUMENTS

JP   2013101851 A   *   5/2013

OTHER PUBLICATIONS

International Search Report and Written Opinion for PCT/US2020/046601 dated Nov. 26, 2020.

*Primary Examiner* — David E Smith
(74) *Attorney, Agent, or Firm* — Moser Taboada

(57) ABSTRACT

Apparatus for a multi-source ion beam etching (IBE) system are provided herein. In some embodiments, a multi-source IBE system includes a multi-source lid comprising a multi-source adaptor and a lower chamber adaptor, a plurality of IBE sources coupled to the multi-source adaptor, a rotary shield assembly coupled to a shield motor mechanism configured to rotate the rotary shield, wherein the shield motor mechanism is coupled to a top portion of the multi-source lid, and wherein the rotary shield includes a body that has one IBE source opening formed through the body, and at least one beam conduit that engages the one IBE source opening in the rotary shield on one end, and engages the bottom portion of the IBE sources on the opposite end of the beam conduit.

18 Claims, 6 Drawing Sheets

(51) Int. Cl.
*H01J 37/20* (2006.01)
*H01J 37/30* (2006.01)

(52) U.S. Cl.
CPC . *H01J 37/3053* (2013.01); *H01J 2237/20207* (2013.01); *H01J 2237/20214* (2013.01); *H01J 2237/20235* (2013.01); *H01J 2237/3174* (2013.01)

(58) Field of Classification Search
CPC ... H01J 2237/20214; H01J 2237/20235; H01J 2237/3174
See application file for complete search history.

(56) References Cited

U.S. PATENT DOCUMENTS

| | | |
|---|---|---|
| 9,132,436 B2 | 9/2015 | Liang et al. |
| 10,283,321 B2 | 5/2019 | Yang et al. |
| 10,302,826 B1 | 5/2019 | Meyer Timmerman Thijssen et al. |
| 2007/0051622 A1 | 3/2007 | Tang et al. |
| 2013/0316536 A1* | 11/2013 | Seto .................. H01L 21/2633 438/689 |
| 2014/0014497 A1 | 1/2014 | Druz et al. |
| 2014/0268080 A1 | 9/2014 | Beasley et al. |
| 2014/0272684 A1* | 9/2014 | Hofmann ............ H01J 37/3405 430/5 |
| 2015/0093907 A1 | 4/2015 | Yieh et al. |
| 2015/0158775 A1 | 6/2015 | Sun et al. |
| 2016/0369395 A1 | 12/2016 | Liang et al. |
| 2017/0115555 A1* | 4/2017 | Hofmann .................. G03F 1/22 |
| 2017/0330788 A1 | 11/2017 | Angelov et al. |
| 2018/0358244 A1 | 12/2018 | Lubomirsky et al. |
| 2019/0131112 A1 | 5/2019 | Ma et al. |

\* cited by examiner

MULTI-SOURCE ION BEAM ETCH SYSTEM

CROSS-REFERENCE

This application claims priority benefit to U.S. provisional application Ser. No. 62/911,326 filed on Oct. 6, 2019 (herein entirely incorporated by reference).

FIELD

Embodiments of the present disclosure generally relate to the field of semiconductor processing, and more specifically to multi-source ion beam etching systems.

BACKGROUND

Ion beam etching (IBE) is a dry plasma etch method which utilizes a remote broad beam ion/plasma source to remove substrate material by physical inert gas and/or chemical reactive gas means. IBE has the ability to include wide range of materials, precision etch stops, and different substrate thicknesses or shapes. Generally, a substrate incorporates a patterned mask, but some applications process blanks. The bombardment of the substrate with an ion beam is well defined and controlled.

Complicated etch processes, such as tight-pitch MRAM magnetic tunnel junction (MTJ) etching, require multiple steps with IBE processes to change etch profiles of the substrates. The multiple steps are to set different etch parameters in the process such as chemistry if gases used, beam angle, beam voltage, beam current, process position, and the like. Different ion beam sources allows for the setting of different etch parameters in the complicated process. However, moving the substrate from one tool have a first ion beam source, to other tools having different ion beam sources to achieve different etch profiles and the like is slow, costly and can introduce defects. Furthermore, changing the ion beam source in current tools to perform different processes/steps can also be slow and costly.

Accordingly, the inventors have provided embodiments of a multi-source ion beam etching system that can perform complicated etch processes, such as tight-pitch MRAM magnetic tunnel junction (MTJ) etching, by using and switching between multiple ion beam sources within a single tool in a quick and efficient manner.

SUMMARY

Apparatus for a multi-source ion beam etching (IBE) system are provided herein. In some embodiments, a multi-source IBE system includes a multi-source lid comprising a multi-source adaptor and a lower chamber adaptor, a plurality of IBE sources coupled to the multi-source adaptor, a rotary shield assembly coupled to a shield motor mechanism configured to rotate the rotary shield, wherein the shield motor mechanism is coupled to a top portion of the multi-source lid, and wherein the rotary shield includes a body that has one IBE source opening formed through the body, at least one beam conduit that engages the one IBE source opening in the rotary shield on one end, and engages the bottom portion of the IBE sources on the opposite end of the beam conduit, a lower processing chamber having a substrate support pedestal, wherein the lower processing chamber is coupled to the lower chamber adaptor, and a rotating lift mechanism coupled to the lower processing chamber configured to rotate, lift and tilt the substrate support pedestal.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
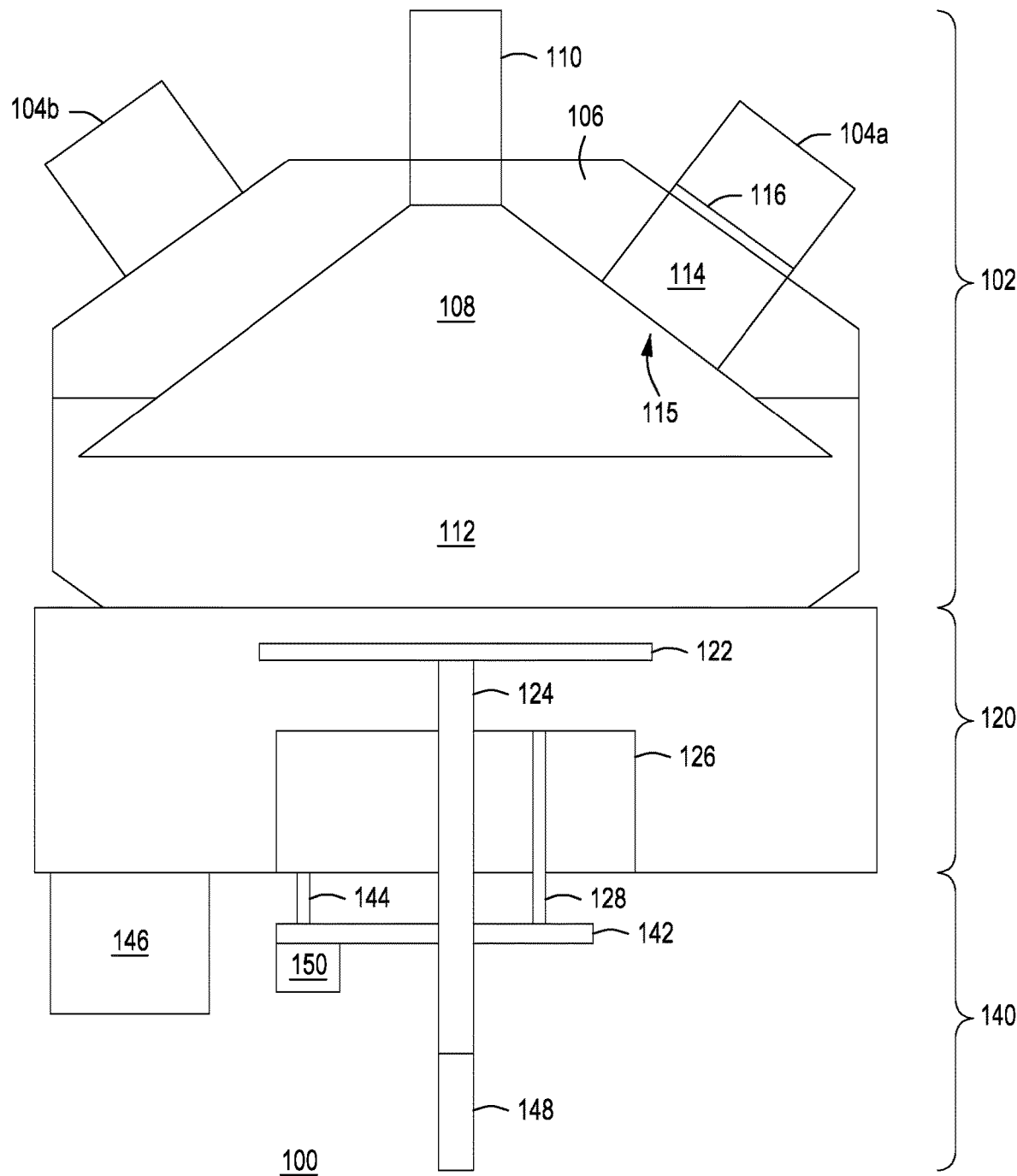
FIG. 1 depicts a schematic view of a multi-source IBE system in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of a multi-source ion beam etching (IBE) system that can perform complicated etch processes, such as tight-pitch MRAM magnetic tunnel junction (MTJ) etching, by using and switching between multiple ion beam sources within a single tool in a quick and efficient manner are provided herein. In some embodiments, multiple IBE sources can be coupled to the upper chamber via a multi-source adaptor and rotary shield that can use two, three, or four IBE sources in different angles. Embodiments of the multi-source IBE system include a grid or showerhead disposed in each IBE source and includes hole patterns and hole angles. Advantages of the multi-source IBE system include the ability to use different grids or showerheads with different angles in the ion beam sources for complicated processes using a single chamber. The multi-source IBE system have the ability to advantageously uses different frequencies with different energies in the ion beam sources for each process step. In addition, the inventive multi-source IBE system described herein allows for different substrate support pedestal process positions (rotation, angles, heights, etc.) with different ion beam angles for each process step.

The inventive multi-source IBE system described herein also advantageously allows the same or different chemistries to be set for each different IBE source.

FIG. 1 depicts at least one embodiments of the inventive multi-source IBE system 100. In some embodiments, the multi-source IBE system 100 includes a multi-source lid 102, a lower processing chamber 120, and a rotating lift mechanism 140. The multi-source lid 102, also referred to herein as the upper chamber, includes multiple ion-beam sources 104a-x that are coupled to the upper chamber via a multi-source adaptor 106. In some embodiments, the multi-source lid 102 can include from 2-6 IBE sources 104a-x in different angles. The multi-source lid 102 further includes a lower chamber adaptor 112 that couples the multi-source adaptor 106, and thus the multi-source lid 102, to the lower processing chamber 120.

Figure 2:
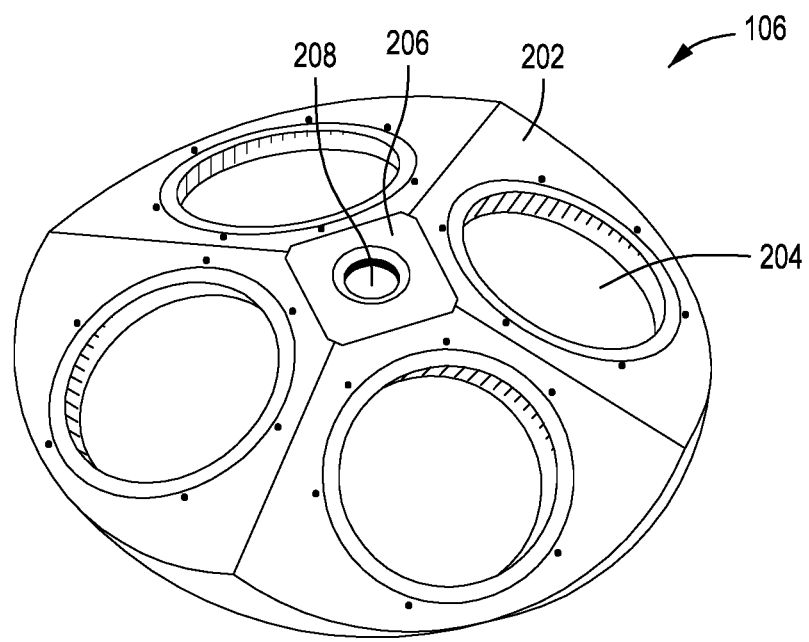
FIG. 2 depicts an isometric view of a multi-source adaptor in accordance with some embodiments of the present disclosure.

FIG. 2 depicts an isometric view of a multi-source adaptor 106 in accordance with some embodiments of the present disclosure. As noted above, the multi-source adaptor 106 couples and secures the multiple ion-beam sources 104a-x to the lid. As shown in FIG. 2, the multi-source adaptor 106 includes a body 202 and a plurality of openings 204. In some embodiments, the body 202 is formed from aluminum or other light weight material. The openings 204 in the adaptor can be circular to accommodate cylindrical IBE sources 104, and can be rectangular to accommodate rectangular IBE sources 104, or a combination of both. The multi-source adaptor 106 includes a top portion 206 and central opening 208 that interfaces with the shield motor mechanism 110 which is coupled to and rotates shield 108.

Figure 3:
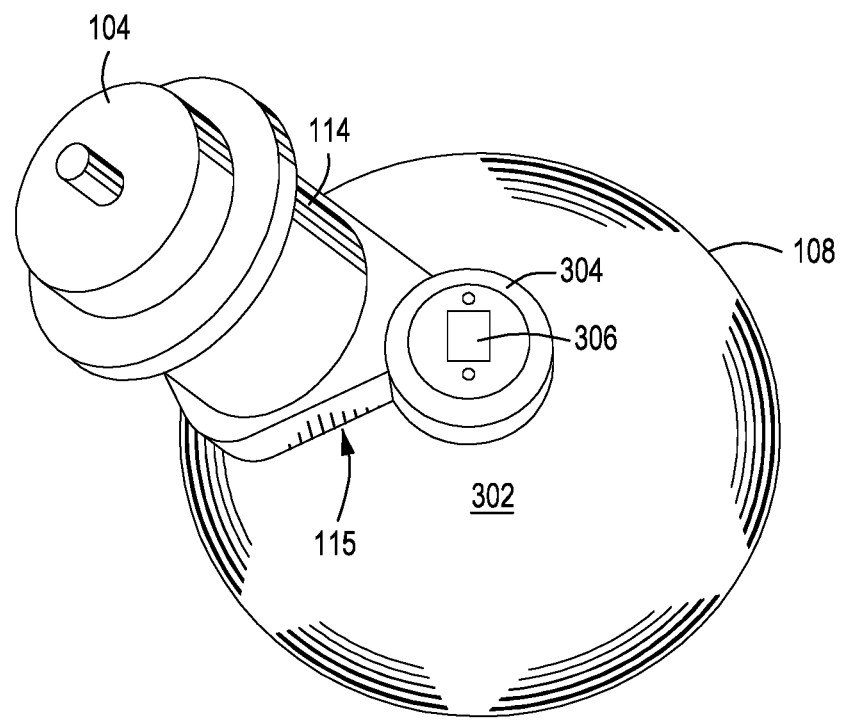
FIG. 3 depicts an isometric view of a rotary shield assembly including an IBE source in accordance with some embodiments of the present disclosure.

FIG. 3 depicts an isometric view of a rotary shield assembly 108 including an IBE source 104 in accordance with some embodiments of the present disclosure. The rotary shield 108 includes a body 302 that has a first opening 115 (i.e., one IBE source opening) formed through the body. A beam conduit 114 is coupled to the first opening 115 on one end, and engages the bottom portion of the IBE sources 104 on the opposite end. Thus, the ion beams formed by the IBE sources 104 travel from the IBE sources 104, through the beam conduit 114, through the first opening 115 formed through the body of the shield 108 and finally towards a substrate disposed in the lower processing chamber 120.

The rotary shield 108 includes a center attachment portion 304 and central opening 306 that couples with and engages a shield motor mechanism 110. The shield motor mechanism 110 supports and rotates the rotary shield 108. The shield motor mechanism 110 is coupled to a top outer portion of the lid 102. The shield motor mechanism 110 includes a motor which rotates the shield 108. In some embodiments, the beam conduit 114 is fixedly attached, and rotates with the rotary shield 108 when rotated by shield motor mechanism 110. In said embodiments, the rotary shield 108 and beam conduit 114 will be rotated to align with one of the multiple IBE sources 104 attached to the multi-source lid 102. All other IBE source 104 openings will be blocked by the shield.

In other embodiments, each of the multiple IBE sources 104 will have its own beam conduit 114 fixedly attached to the bottom portion of an IBE source 104. In those embodiments, the rotary shield 108 will be rotated to align with one of the multiple IBE sources 104 and beam conduit 114 with the first opening 115 formed through the body of the shield 108. All other IBE source openings will be blocked by the shield.

Figure 4:
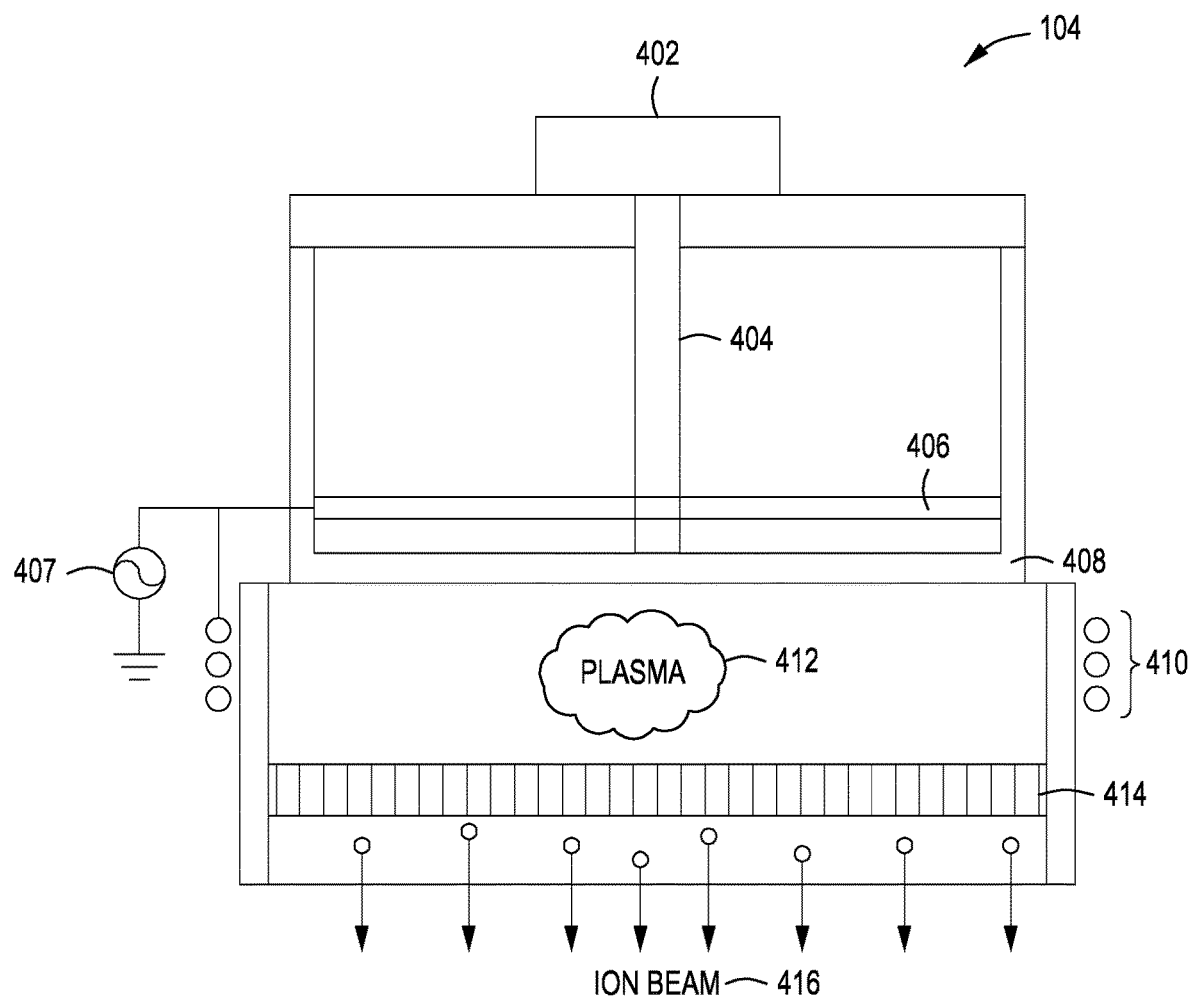
FIG. 4 depicts a schematic view of an IBE source in accordance with some embodiments of the present disclosure.

FIG. 4 depicts a schematic view of an IBE source in accordance with some embodiments of the present disclosure. Each IBE source 104 can be an inductively coupled plasma (ICP), capacitively coupled plasma (CCP), hybrid ICP/CCP, microwave, or other IBE source. Each IBE source 104 can use different frequencies with different energies for each process step. In addition, each IBE source 104 can use the same or different chemistries to be set for each process step. In some embodiments, the IBE source produces an Argon or Krypton ion beam 416. In some embodiments, the IBE sources 104a-x can be cylindrical or rectangular designs, and a combination of both.

Each IBE source 104 includes a gas supply 402 that supplies various gas chemistries through gas conduit 404 to gas ring 408. The RF supply 407 is coupled to an RF plate 406 and RF coils 410 which cause the gases provided to form a plasma 412 in the IBE source 104 above an ion distribution grid 414. The grid 414 (also referred to as a showerhead or gas distribution assembly) is configured to distribute/flow ions at various angles/patterns that can be controlled based on the grid aperture/hole patterns. While conventional grid designs may simply provide pass through distribution systems for processing and precursor gases, the presently described technology allows for improved control of the flow characteristics of ions/gases as they are delivered to a substrate processing chamber. In so doing, etching/deposition operations may produce more accurate film profiles during manufacturing operations. The grid 414 or showerhead disposed in each IBE source includes hole patterns and hole angles of 0° to 45°, or more. The grid or showerhead can have single or dual gas channels. The grid 414 can be formed of aluminum, stainless steel, nickel alloy, titanium, molybdenum, tungsten, or any material able to withstand the high temperatures produced within the IBE source 104 (e.g., about 400 degrees Celsius to about 800 degrees Celsius).

Figure 5A:
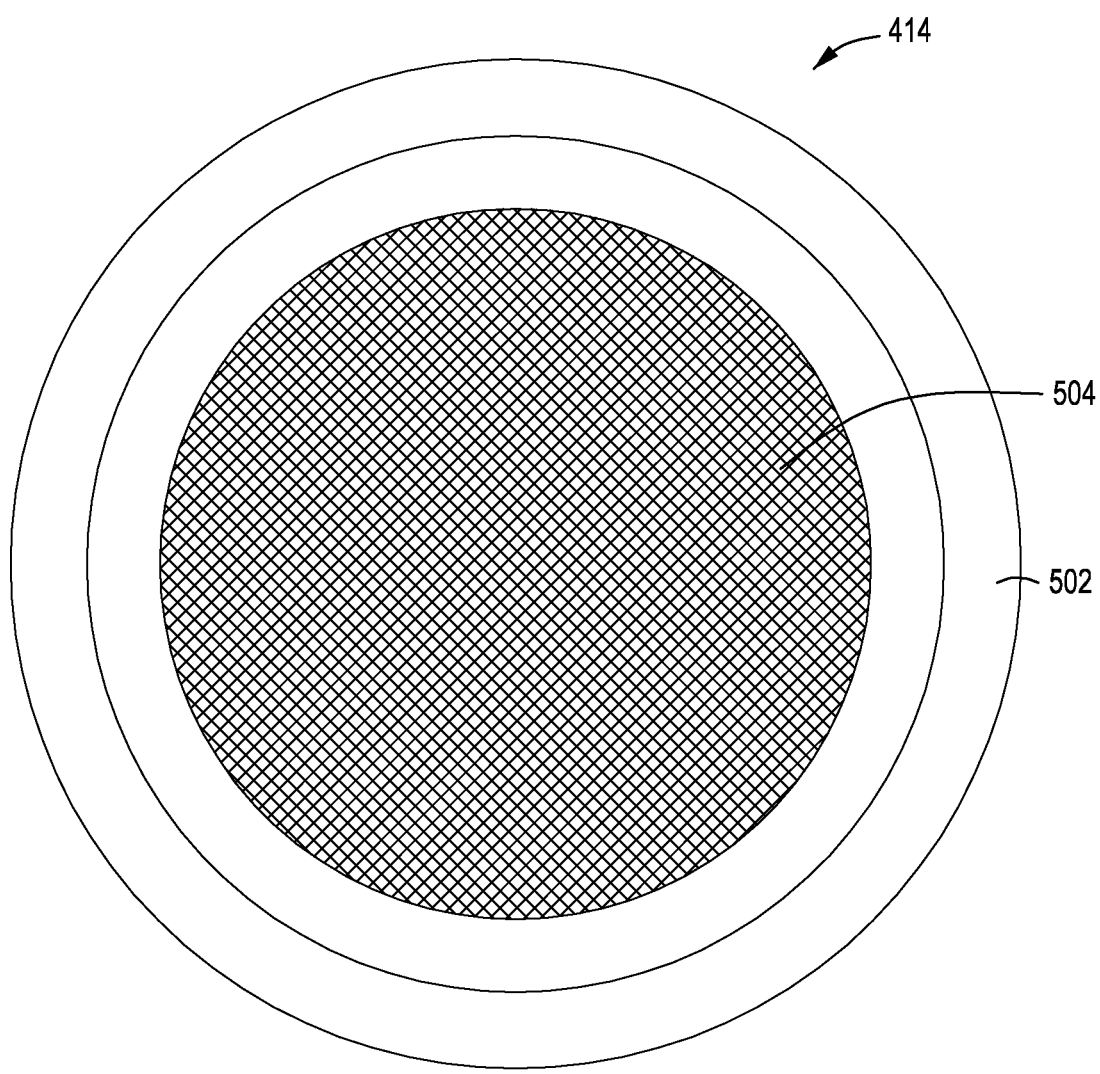
FIG. 5A depicts a schematic top view of the grid in accordance with some embodiments of the present disclosure.
Figure 5B:
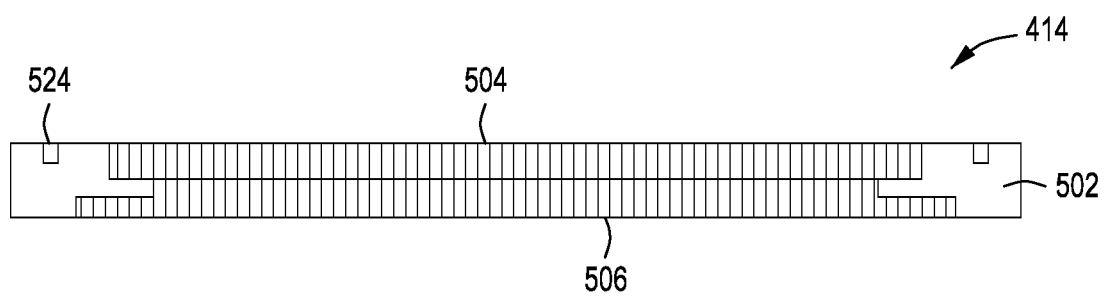
FIG. 5B depicts a cross-sectional side view of the grid in accordance with some embodiments of the present disclosure.
Figure 5C:
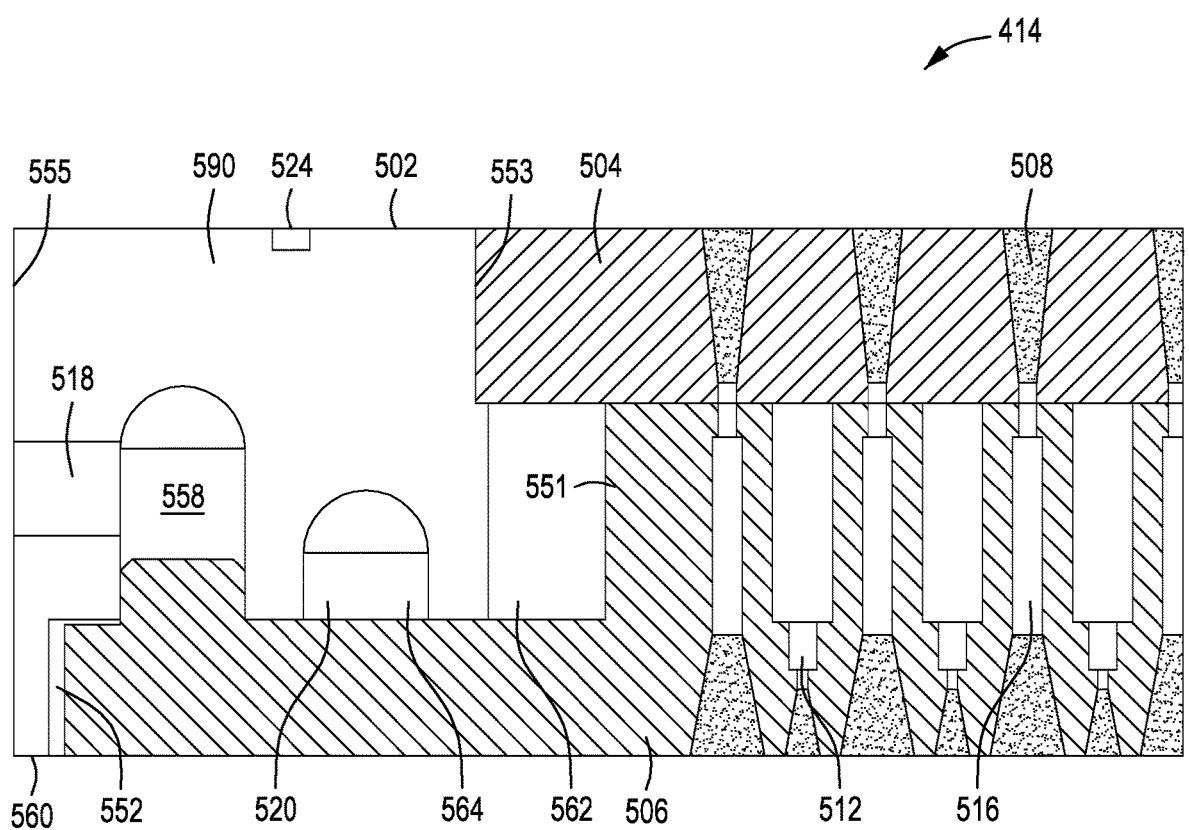
FIG. 5C depicts a cross-section side view of a dual channel grid in accordance with some embodiments of the present disclosure.

The grid 414 is shown in further details in FIGS. 5A-5C. FIG. 5A depicts a top down schematic view of the grid, and FIG. 5B depicts a side cross-section view of the grid 414 in accordance with some embodiments of the present disclosure. FIG. 5C depicts a more detailed side cross-section view of a dual channel grid in accordance with some embodiments of the present disclosure. The grid 414 includes an outer annular body 590 that supports/retains an upper grid 504 and a lower grid 506. The outer annular body 590 can be circular as shown in some embodiments. In other embodiments, were the IBE source 104 is rectangular, the grid 414 may also have a rectangular shape. One or more fluid/gas channels may be formed in the outer annular body 590. In some embodiments, the outer annular body 590 may have an inner diameter of about 10 inches to about 15 inches.

For example, in some embodiments, one or more fluid/gas channels 518, 520, 524 and 558 may be formed in the outer annular body 590. One or more of fluid/gas channels 518, 520, 524 and 558 may be used to supply one or more gases. In some embodiments, one or more of fluid/gas channels 518, 520, 524 and 558 may be used to supply cooling gases since the grid 414 is exposed to very high temperatures. In other embodiments, one or more of fluid/gas channels 518, 520, 524 and 558 may be used to supply processing gases to that portion of the IBE source 104.

The purpose of the grid 414 is to direct the ion beams at the pre-defined angles to control how the ion beam strikes the substrate surface. It controls the angle, direction, and/or amount if ions striking the substrate through holes formed in the grid 414. In some embodiments, the hole pattern of the upper grid 504 and/or the lower grid 506 may be a triangle pitch hole pattern and have hole angles from 0° to 45°. In some embodiments, the triangle pattern acts as the pitch, and the same pitch is used to spread the holes. Thus, the triangle pattern ensures that each hole is the same distance from each other to make the flow of the ion beam more uniform.

In some embodiments, the upper grid 504 may have a set of first apertures/holes (i.e., first aperture 508) with a diameter that is 2-3 times larger than the diameter of corresponding apertures/holes 512 in the lower grid 506. In some embodiments, the holes in the lower grid 506 may be larger than the holes in the upper grid 504. In some embodiments, the holes diameters in the upper grid 504 may be 0.01-0.05 inches. In some embodiments, the holes diameters in the lower grid 506 may be 0.005-0.030 inches. The lower grid 506 may further include other apertures/holes 514, 516 or channels 510.

Referring to FIG. 5C, annular body 590 may include an upper recess 553 in upper surface 502, and a lower recess 552 in lower surface 560. A first fluid channel 520 may be defined in the lower surface 560 and may be located in the annular body radially inward of the lower recess 552. The first fluid channel may be annular in shape, and the channel may be covered by lower grid 506. A plurality of ports 562 may be at least partially defined in the annular body at the inner annular wall 551, and may be located along the entire channel at defined intervals that may be equal or modified across the plurality of ports. In disclosed embodiments, lower grid 506 (also referred to as a lower plate) may define a top portion of the plurality of ports 562. Upper plate 570 may be coupled with the annular body 590 at upper recess 553, and the upper plate 570 may define a plurality of first apertures 508. Lower grid 506 may be coupled with the annular body 590 at the lower recess 552, and may cover first fluid channel 520. Lower grid 506 may define a plurality of second apertures 516 that may align with the first apertures 508 defined in the upper plate 570 in order to form a first set of channels through the grid 414. The lower grid 506 may also define a plurality of third apertures 512 that are located between and around the second apertures 516. The lower grid 506 may include raised portions around second apertures 516 that extend up to the upper plate 570 to produce fluidly isolated channels through the assembly.

The upper and lower plates may be sealingly coupled with one another such that the first and second apertures are aligned to form a channel through the upper and lower plates with the raised portions of the lower plate such that an internal volume is defined between the upper and lower plate. The volume may be fluidly accessed through the plurality of ports 562. The assembly may be configured such that a first fluid may flow through the first apertures and extend through the grid 414 through the isolated channels formed between the first and second apertures. Additionally, a second fluid may be flowed through the assembly via the first fluid channel 520 and delivered into the volume defined between the upper and lower plates. The fluid flowing through the volume may flow through the third apertures and around the raised portions of the lower plate such that the first and second fluid may be fluidly isolated through the showerhead, and remain separated until they exit the lower plate through the second and third apertures respectively.

The first apertures 508 may be shaped to suppress the migration of ionically-charged species out of the plasma region, while allowing uncharged neutral or radical species to pass through the grid 414. These uncharged species may include highly reactive species that are transported with less reactive carrier gas through the holes. As noted above, the migration of ionic species through the holes may be reduced, and in some instances completely suppressed. Controlling the amount of ionic species passing through the grid 414 may provide increased control over the gas mixture brought into contact with the underlying wafer substrate, which in turn increases control of the deposition and/or etch characteristics of the gas mixture. Accordingly, in disclosed embodiments, the first apertures may include a conical shape extending through the upper plate with decreasing diameter in order to control fluid characteristics. This upper plate may specifically act as an ion-suppression plate or ion blocker such that a configuration effectively combines ion-suppression directly into the showerhead design, and an additional suppression element may not be additionally required.

Each first aperture 508 may have a conical inlet portion tapering to a first cylindrical portion that intersects second apertures 516. The second apertures may include multiple sections of various shapes to further affect fluid flow through the channels formed between the first and second apertures. In an exemplary design, the second apertures 516 may include multiple cylindrical sections of increasing diameter leading to a conical section extending with increasing diameter to the bottom of the lower grid 506. Third apertures 512 may similarly include multiple sections of various shapes, and in an exemplary configuration the third apertures 512 may include multiple cylindrical sections of decreasing diameter leading to a conical section extending with increasing diameter to the bottom of the lower grid 506. In disclosed embodiments, the second and third apertures include at least three sections of different shape or diameter.

For ion-suppression assemblies such as exemplary configuration grid 414, the number of apertures may be increased. Providing a greater number of apertures may increase the density of species delivered to the processing region of the chamber.

Referring back to FIG. 4B, the gas distribution assembly may additionally include a second fluid channel 558 defined in the lower surface 560 that is located in the annular body 590 radially outward of the first fluid channel 520. The second fluid channel 558 may be formed around the entire annular body, and may also be concentric with the first fluid channel 520. A second plurality of ports 564 may be defined in at least a portion of the annular body defining an outer wall of the first fluid channel 520 and an inner wall of the second fluid channel 558. The second fluid channel 558 may also be located radially inward of the lower recess such that the second fluid channel is covered by the lower grid 506. In some embodiments, a portion of the lower grid 506 may extend up into the second fluid channel 558.

The portion of the lower grid 506 may extend into the second channel above a level of the top of the lower recess 552. In disclosed embodiments, second fluid channel 558 is formed to a greater height in the lower surface 560 than the first fluid channel 520. The portion of lower grid 506 extending into the second fluid channel 558 may extend to a height equivalent to the height of the first fluid channel 520 or less within the annular body 590, or to a height equivalent to about half of the height of first fluid channel 520. As explained above, a portion of the lower plate extending into the second fluid channel 558 may limit the effects of warping that may occur in the lower plate when it is coupled with the annular body 590. In some embodiments, the second plurality of ports 564 may be defined in the lower surface 560. The bottom of the plurality of ports 564 may be defined by the top surface of the lower grid 506.

The second plurality of ports 564 may be formed at an angle decreasing vertically between the second fluid channel 558 and the first fluid channel 520. By forming the ports at an angle, the ports may not be blocked by the portion of the lower plate extending into the second fluid channel 558. In disclosed embodiments the second plurality of ports 564 may be slots of various shapes or dimensions formed in the annular body, and may be angled downward from the second fluid channel 558 to the first fluid channel 520 such that the ports are fluidly accessible above the portion of the lower plate extending into the second fluid channel 558. In operation, a fluid may be delivered through the grid 414 through a side port in the chamber, for example, fluid delivery channel 518. The fluid may flow into second fluid channel 558 and then through the second plurality of ports 564 that may fluidly couple the second fluid channel 558 with the first fluid channel 520. The fluid may then flow through the first plurality of ports 562 that may fluidly couple the first fluid channel 520 with the volume defined between the upper grid 504 and lower grid 506. The fluid may continue to flow through third apertures 512 into the processing region. In this configuration, such a fluid may be fluidly isolated from the first and second apertures that form channels through the gas distribution assembly. In this way, the distribution assembly may prevent the flow of this fluid from accessing the first apertures, and may prevent the fluid from flowing through the top of the gas distribution assembly without a pressure differential or forced flow.

Figure 6:
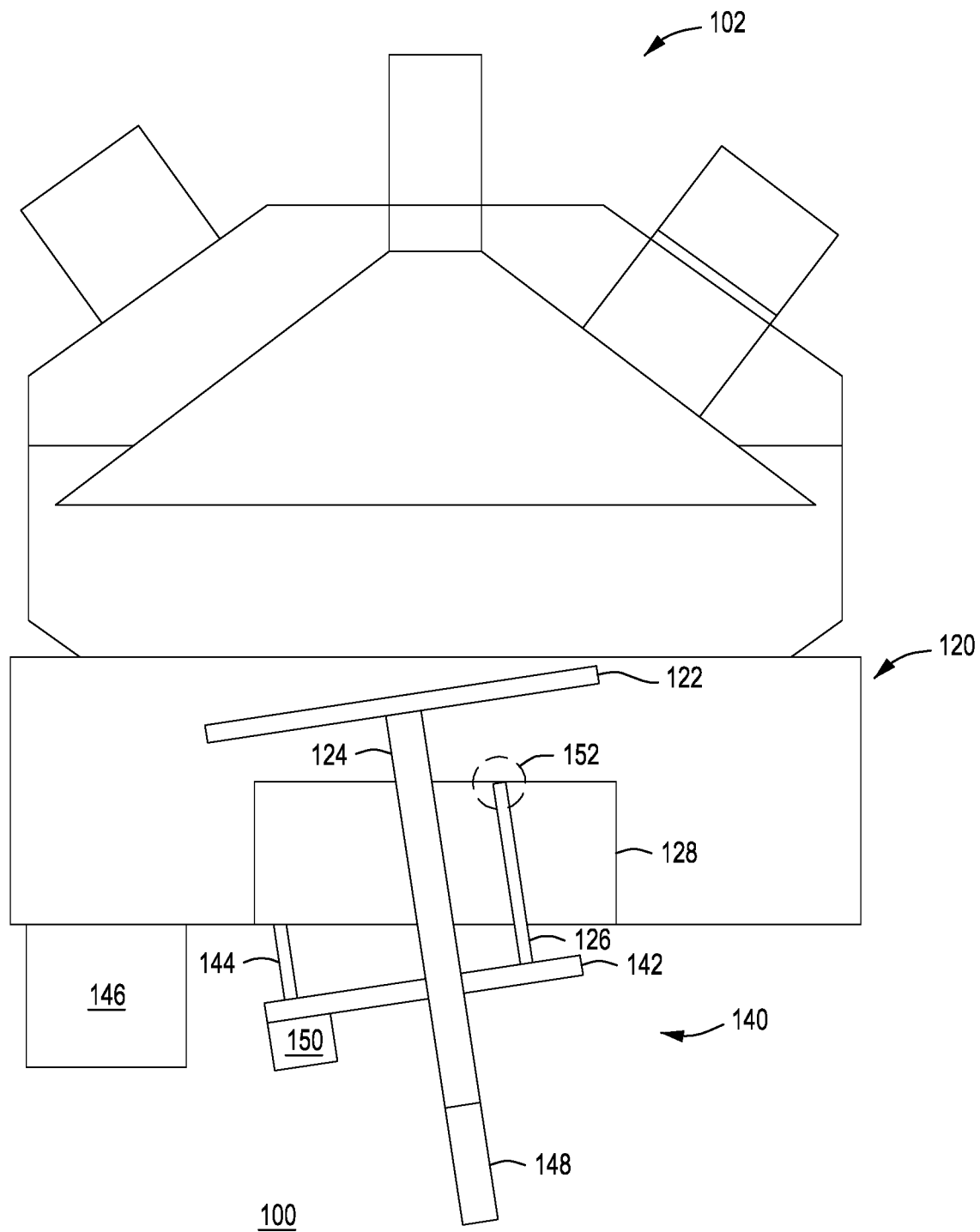
FIG. 6 depicts the lower processing chamber and rotating lift mechanism of FIG. 1 with the substrate support in a tilted position in accordance with the present disclosure.

Returning to FIG. 1, the details of the lower processing chamber 120 and rotating lift mechanism 140 are now described. The lower processing chamber 120 includes a substrate support pedestal comprising a substrate support 122 configured to support a substrate when disposed thereon and a rotating shaft 124. The substrate support 122 is coupled to the rotating shaft 124 which is coupled to a first motor unit 148 configured to rotate the rotating shaft 124 and substrate support 122 about its central exist. The rotating shaft 124 passes through and pivots, at least in part, within a rotating lift support 126. The tilting/pivoting of the substrate support 122 and rotating shaft 124 is accomplished via one or more pivot rods, support plates, and motors. In some embodiments a first pivot rod 128 is coupled to a pivot support plate 142 and a top portion of the rotating lift support 126. In addition, a second pivot rod 144 is coupled to the bottom portion of the rotating lift support 126, or a bottom portion of the lower chamber 120. In some embodiments, one end of the second pivot rod 144 passes through pivot support plate 142 and coupled to a second motor 150 moves which moves the second pivot rod 144, or otherwise adjusts its length, to cause the entire substrate support 122 and rotating shaft 124 to pivot/tilt about pivot point 152. That is, as shown in FIG. 6, the second motor 150 precisely controls and adjusts the amount of tilt of the substrate support 122 about pivot point 152. In some embodiments, a turbo or cryo pump 146 is coupled to the lower chamber 120 which controls the pressure within the chamber.

Through the use of the multi-source IBE sources and the rotating tilting lift mechanism as described above, embodiments of the inventive multi-source IBE system 100 described herein can perform IBE etching processes, such as tight-pitch MRAM magnetic tunnel junction (MTJ) etching. Specifically, by tight pitch, the inventive multi-source IBE system 100 described herein can create pitches of about 50-200 nanometers. Furthermore, the inventive multi-source IBE system 100 described herein and advantageously can adjust beam voltage, beam current, frequencies, chemistries, etc., independently or in conjunction with other beam parameters. In addition, in some configurations, the inventive multi-source IBE system 100 could be running independently at different two or more different angles.

While the foregoing is directed to embodiments of the present disclosure, other and further embodiments of the disclosure may be devised without departing from the basic scope thereof.

The invention claimed is:

1. A multi-source ion beam etching (IBE) system, comprising:
 a multi-source lid comprising a multi-source adaptor and a lower chamber adaptor;
 a plurality of IBE sources coupled to the multi-source adaptor;
 a rotary shield assembly coupled to a shield motor mechanism configured to rotate the rotary shield, wherein the shield motor mechanism is coupled to a top portion of the multi-source lid, and wherein the rotary shield includes a body that has one IBE source opening formed through the body;
 at least one beam conduit that engages the one IBE source opening in the rotary shield on one end, and engages a bottom portion of the IBE sources on the opposite end of the beam conduit;
 a lower processing chamber having a substrate support pedestal, wherein the lower processing chamber is coupled to the lower chamber adaptor; and
 a rotating lift mechanism coupled to the lower processing chamber configured to rotate, lift and tilt the substrate support pedestal.

2. The multi-source IBE system of claim 1, wherein the multi-source adaptor secures the plurality of IBE sources to the multi-source lid.

3. The multi-source IBE system of claim 1, wherein the multi-source adaptor includes a body and a plurality of openings about which each of the plurality of IBE sources are coupled.

4. The multi-source IBE system of claim 1, wherein the body of the multi-source adaptor is formed from aluminum.

5. The multi-source IBE system of claim 1, wherein the openings of the multi-source adaptor are circular to accommodate cylindrical IBE sources, are rectangular to accommodate rectangular IBE sources, or a combination of both circular and rectangular.

6. The multi-source IBE system of claim 1, wherein the multi-source adaptor includes a top portion and a central opening that interfaces with the shield motor mechanism which is coupled to and rotates the rotary shield.

7. The multi-source IBE system of claim 1, wherein there is one beam conduit that is fixedly attached and rotates with the rotary shield when rotated by shield motor mechanism.

8. The multi-source IBE system of claim 7, wherein the rotary shield and beam conduit are configured to be rotated to align the one IBE source opening with one of the plurality of IBE sources attached to the multi-source lid.

9. The multi-source IBE system of claim 8, wherein all other IBE sources not aligned with the one IBE source opening are blocked by the shield.

10. The multi-source IBE system of claim 1, wherein each of the plurality of IBE sources is coupled to a beam conduit.

11. The multi-source IBE system of claim 10, wherein the rotary shield is configured to be rotated to align the one IBE source opening with one of the beam conduits and one of the plurality of IBE sources attached to the multi-source lid.

12. The multi-source IBE system of claim 11, wherein all other beam conduits and plurality of IBE sources IBE sources not aligned with the one IBE source opening are blocked by the shield.

13. A multi-source ion beam etching (IBE) system, comprising:

a multi-source lid comprising a multi-source adaptor and a lower chamber adaptor;

a plurality of IBE sources coupled to the multi-source adaptor;

an ion distribution grid assembly disposed in each of the plurality of IBE sources, wherein the ion distribution grid assembly includes a lower grid, an upper grid, and one or more channels may be formed in the outer annular body;

a rotary shield assembly coupled to a shield motor mechanism configured to rotate the rotary shield, wherein the shield motor mechanism is coupled to a top portion of the multi-source lid, and wherein the rotary shield includes a body that has one IBE source opening formed through the body; and at least one beam conduit that engages the one IBE source opening in the rotary shield on one end, and engages a bottom portion of the IBE sources on the opposite end of the beam conduit.

14. The multi-source IBE system of claim 13, wherein each grid includes triangular pitch hole patterns and have hole angles of 0° to 45°.

15. The multi-source IBE system of claim 13, wherein the grid is configured to direct ion beams at a pre-defined angle to control how the ion beam strikes a substrate surface.

16. The multi-source IBE system of claim 13, wherein the upper grid includes a set of first apertures with diameters that are approximately 2 to 3 times larger than diameters of corresponding apertures in the lower grid.

17. The multi-source IBE system of claim 13, wherein the one or more channels may be formed in the outer annular body includes a first fluid channel formed in a lower surface of the annular body, and a second fluid channel that is located in the radially outward of the first fluid channel.

18. A multi-source ion beam etching (IBE) system, comprising:

a multi-source lid comprising a multi-source adaptor and a lower chamber adaptor;

a plurality of IBE sources coupled to the multi-source adaptor;

a rotary shield assembly coupled to a shield motor mechanism configured to rotate the rotary shield;

at least one beam conduit that engages the one IBE source opening in the rotary shield on one end, and engages a bottom portion of the IBE sources on the opposite end of the beam conduit;

a lower processing chamber having a substrate support pedestal, wherein the lower processing chamber is coupled to the lower chamber adaptor; and a rotating lift mechanism coupled to the lower processing chamber configured to rotate, lift and/or tilt the substrate support pedestal, wherein one or more pivot rods, support plates, and/or motors are used to tilt and pivot the substrate support.

* * * * *